United States Patent
Yeh et al.

(10) Patent No.: US 9,319,007 B2
(45) Date of Patent: Apr. 19, 2016

(54) THREE-DIMENSIONAL POWER AMPLIFIER ARCHITECTURE

(71) Applicant: National Taiwan University, Taipei (TW)

(72) Inventors: Jin-Fu Yeh, Taipei (TW); Jeng-Han Tsai, Taipei (TW); Tian-Wei Huang, Taipei (TW)

(73) Assignee: National Taiwan University, Taipei (TW)

( * ) Notice: Subject to any disclaimer, the term of this patent is extended or adjusted under 35 U.S.C. 154(b) by 129 days.

(21) Appl. No.: 14/168,773

(22) Filed: Jan. 30, 2014

(65) Prior Publication Data

US 2015/0214994 A1 Jul. 30, 2015

(51) Int. Cl.
*H03F 3/00* (2006.01)
*H03F 1/56* (2006.01)
(Continued)

(52) U.S. Cl.
CPC ............... *H03F 1/56* (2013.01); *H03F 3/195* (2013.01); *H03F 3/211* (2013.01); *H03F 3/24* (2013.01); *H03F 3/45475* (2013.01); *H03F 2200/255* (2013.01); *H03F 2200/318* (2013.01); *H03F 2200/387* (2013.01); *H03F 2200/423* (2013.01); *H03F 2200/451* (2013.01); *H03F 2200/534* (2013.01); *H03F 2200/541* (2013.01); *H03F 2203/45644* (2013.01); *H03F 2203/45731* (2013.01); *H04B 2001/0408* (2013.01)

(58) Field of Classification Search
USPC ........... 455/103, 13.4, 78, 208; 330/197, 253, 330/276, 273, 127, 286, 54; 333/127, 213, 333/125, 33, 105, 101
See application file for complete search history.

(56) References Cited

U.S. PATENT DOCUMENTS

| 2009/0002586 A1* | 1/2009 | Kimura | G02F 1/136213 349/39 |
| 2009/0174515 A1* | 7/2009 | Lee | H01F 27/2804 336/182 |

(Continued)

OTHER PUBLICATIONS

Yeh et al., "A 60-GHz Power Amplifier Design Using Dual-Radial Symmetric Architecture in 90-nm Low-Power CMOS", IEEE Transactions on Microwave Theory and Techniques, vol. 61, No. 3 (2013).

*Primary Examiner* — Ganiyu A Hanidu
(74) *Attorney, Agent, or Firm* — Mintz Levin Cohn Ferris Glovsky and Popeo, P.C.; Peter F. Corless; Steven M. Jensen

(57) ABSTRACT

The present disclosure provides a three-dimensional (3-D) transformer-based (TF-based) power amplifier architecture, including a power splitting plane having at least one input transformer-based circuit; and a power combining plane having at least one output transformer-based circuit. The power splitting plane includes at least one input transmission line, at least one input transformer and an input terminal. Moreover, the power combining plane includes at least one output transmission line, at least one output transformer, at least one power amplifier-cell (PA-cell) and an output terminal. The power combining plane is vertically stacked, attached and electrically connected to the power splitting plane. Consequently, as compared with the existing 2-D power amplifiers, the 3-D transformer-based power amplifier architecture of the present disclosure is capable of achieving a symmetric and compact power distribution layout. Accordingly, the present disclosure further provides an integrated circuit layout for the 3-D TF-based power amplifier architecture.

25 Claims, 8 Drawing Sheets

(51) Int. Cl.
*H03F 3/195* (2006.01)
*H03F 3/21* (2006.01)
*H03F 3/24* (2006.01)
*H03F 3/45* (2006.01)
*H04B 1/04* (2006.01)

(56) References Cited

U.S. PATENT DOCUMENTS

| | | | | |
|---|---|---|---|---|
| 2010/0244962 A1* | 9/2010 | Jen | .......... | H03F 1/223 330/276 |
| 2011/0210792 A1* | 9/2011 | Kawakami | .............. | H03F 3/195 330/253 |
| 2012/0062335 A1* | 3/2012 | Sherrer | ..................... | H01P 5/12 333/127 |
| 2013/0099864 A1* | 4/2013 | Kawai | ....................... | H01P 5/10 330/273 |
| 2013/0257509 A1* | 10/2013 | Wang | ...................... | H03F 3/602 327/361 |
| 2013/0316668 A1* | 11/2013 | Davierwalla | ............. | H03G 3/20 455/208 |
| 2014/0043104 A1* | 2/2014 | Chen | .......................... | G06F 1/10 331/46 |
| 2014/0085001 A1* | 3/2014 | Anderson | ............. | H03F 1/0227 330/197 |

* cited by examiner

THREE-DIMENSIONAL POWER AMPLIFIER ARCHITECTURE

BACKGROUND

1. Field of the Invention

The present disclosure relates to a power amplifier, and more specifically to a three-dimensional (3-D) power amplifier architecture.

2. Description of Related Art

Nowadays, the significant growth of data rates has enabled the evolution of new high-speed wireless networking standards such as IEEE 802.11ad and IEEE 802.15.3c. However, one of the challenges for Gigahertz radio such as 60 GHz is to provide high radiated power with a view to extending communication distances.

In recent years, conventional hybrid coupled power combiners such as a 90° coupler and a Wilkinson combiner have been realized in the millimeter-wave (MMW) power amplifiers due to their simplicity in structure.

Moreover, except for the conventional hybrid coupled power combiners, on-chip miniature transformer-based (TF-based) power combiners also have been successfully implemented in MMW power amplifiers. The techniques for implementing the TF-based power combiners can be categorized as a TF-based voltage combining technique, a TF-based current combining technique or a combination thereof. However, several critical design issues have to be overcome when a TF-based power combiner is designed by using the TF-based voltage combining technique. For example, when the TF-based voltage combining technique is applied to the design of a TF-based power amplifier, the required impedance of each power amplifier cell will become smaller since the number of combined power amplifier cells is increased. Therefore, it is difficult for a low-impedance device to provide high gain/high power in the MMW frequency for driving a large device periphery.

On the other hand, in addition to the TF-based voltage/current combining technique, the TF-based power combining technique has the advantage of a smaller chip area over the conventional binary power combining technique and the TF-based voltage/current combining technique.

Traditionally, an on-chip power amplifier with a splitter and a combiner is a two-dimensional (2-D) architecture. That is to say, the power splitter usually occupies most of the chip area of the on-chip power amplifier. U.S. patent application Ser. No. 12/242,892 discloses a power amplifier system, as shown in FIG. 1. The power amplifier system includes a plurality of 2-D power amplifiers and a transformer power combiner. The transformer power combiner has a plurality of input ports respectively coupled to the power amplifiers and an output port coupled to an output load $Z_L$. The transformer power combiner also includes a plurality of voltage combiners and a current combiner. Accordingly, differential feeding electrical connection lines of the 2-D power splitting network are required to be interleaved in order to maintain a symmetric layout such that the routing layout is getting very complicated. Therefore, the 2-D power distribution network requires a larger chip area and a complicated symmetric layout design, as compared to the design of the on-chip power amplifier using the TF-based power combining technique.

As such, for the sake of meeting the requirements of the small chip area, low cost and high output power, it is necessary to design an integrated miniaturize power amplifier capable of providing high output power in terms of the cost effectiveness, uncomplicated structure, compact design and versatility.

Accordingly, solutions to the problems described above have been long sought, but prior developments have not taught or suggested any solutions and, thus, solutions to the problems have long eluded those skilled in the art. Therefore, there is a heretofore-unaddressed need to overcome defects and shortcomings described above.

SUMMARY

In light of the foregoing drawbacks, an objective of the present disclosure is to provide a three-dimensional (3-D) power amplifier architecture, thereby effectively reducing the cost and integrated circuit (IC) layout area. The present disclosure also overcomes the drawbacks of the high-frequency (such as GHz) power amplifier, which is not capable of integrating transformers and other components such as transistors, resistors and capacitors on a single silicon wafer.

In accordance with the above and other objectives, the present disclosure provides a 3-D power amplifier architecture, comprising a power splitting plane comprising at least one input transformer-based circuit having at least one input transmission line, at least one input transformer and an input terminal; and a power combining plane comprising at least one output transformer-based circuit having at least one output transmission line, at least one output transformer, at least one power amplifier-cell (PA-cell) and an output terminal.

Moreover, the power combining plane is vertically stacked and attached to the power splitting plane.

The present disclosure further comprises a radio-frequency (RF)/mixed-signal integrated circuit, a baseband integrated circuit and an antenna. An output of the RF/mixed-signal integrated circuit is vertically and electrically connected to the input terminal of the power splitting plane. An output of the baseband integrated circuit is vertically and electrically connected to an input of the RF/mixed-signal integrated circuit. In addition, the output terminal of the power combining plane is vertically and electrically connected to an input of the antenna.

According to the present disclosure, the RF/mixed-signal integrated circuit, the baseband integrated circuit and the antenna are vertically stacked, attached and electrically connected to the 3-D power amplifier architecture.

Further, the present disclosure also provides an integrated circuit (IC) layout for the 3-D power amplifier architecture, comprising a power splitting plane having at least one input transmission line, at least one input transformer and an input terminal; and a power combining plane having at least one output transmission line, at least one output transformer, at least one PA-cell and an output terminal, wherein the power combining plane and the power splitting plane are electrically connected and placed in different layers.

Besides, the IC layout of the present disclosure further comprises a RF/mixed-signal integrated circuit chip, a baseband integrated circuit and an antenna. An output of the RF/mixed-signal integrated circuit chip is vertically and electrically connected to the input terminal of the power splitting plane. An output of the baseband integrated circuit is vertically and electrically connected to an input of the RF/mixed-signal integrated circuit. In addition, the output terminal of the power combining plane is vertically and electrically connected to an input of the antenna.

In accordance with the present disclosure, the 3-D power amplifier architecture, the RF/mixed-signal integrated circuit chip, the baseband integrated circuit and the antenna are vertically and electrically connected and placed in different layers.

Certain embodiments of the present disclosure have other components in addition to or in place of those mentioned above. The components will become apparent to persons skilled in the art from a reading of the following detailed description when taken with reference to the accompanying drawings.

BRIEF DESCRIPTION OF DRAWINGS

The present disclosure can be more fully understood by reading the following detailed description of the preferred embodiments, with reference made to the accompanying drawings, wherein.

DETAILED DESCRIPTION

Figure 1:
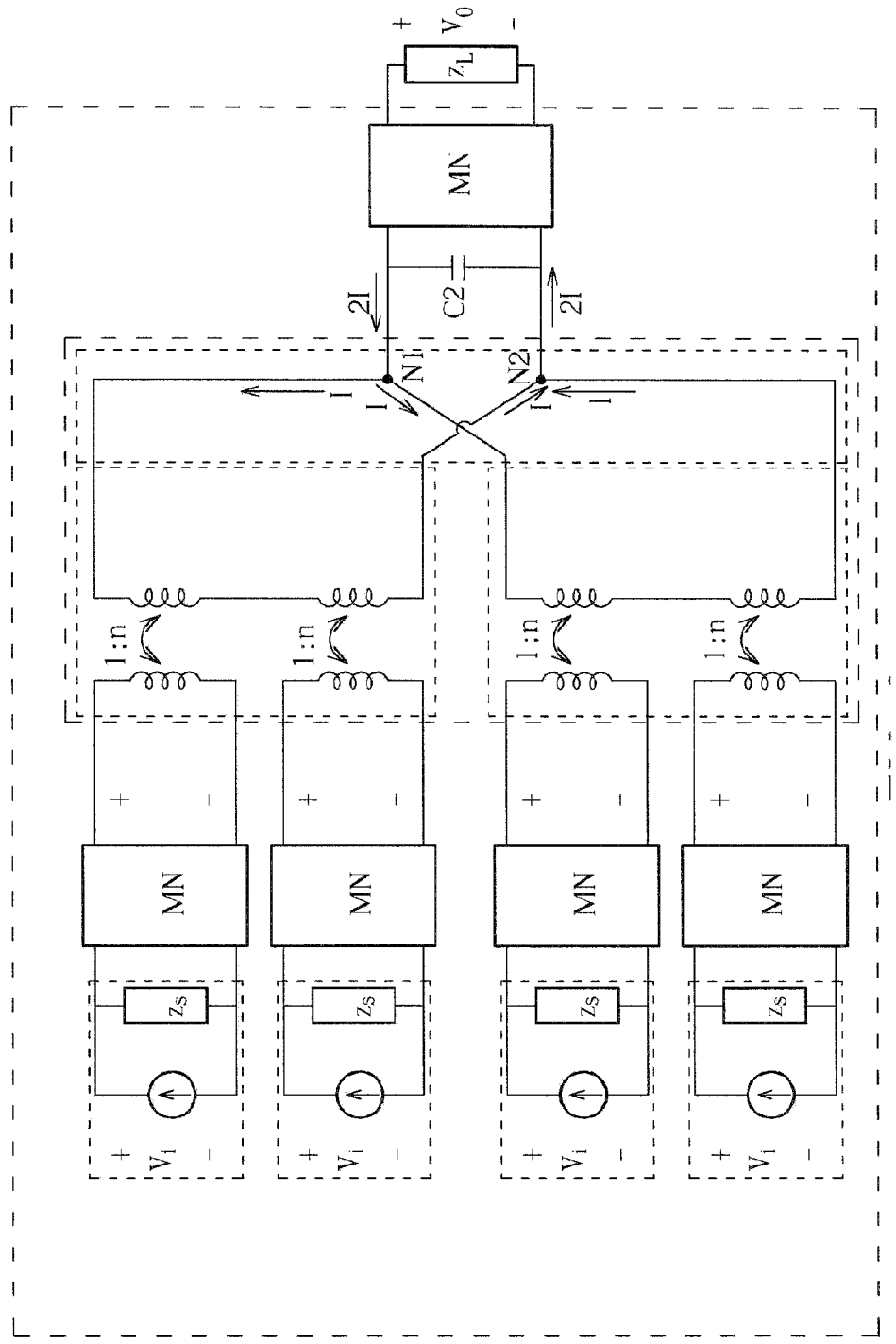
FIG. 1 is a schematic diagram depicting a prior art two-dimensional (2-D) power amplifier system.

The following embodiments are described in sufficient detail to enable those skilled in the art to make and use the present disclosure. It is to be understood that other embodiments would be evident based on the present disclosure, and that system or mechanical changes may be made without departing from the scope of the present disclosure.

In the following description, numerous specific details are given to provide a thorough understanding of the present disclosure. However, it will be apparent that the present disclosure may be practiced without these specific details. In order to avoid obscuring the present disclosure, some well-known mechanisms and system configurations are not disclosed in detail.

The drawings showing embodiments of the architecture are semi-diagrammatic and not to scale and, particularly, some of the dimensions are for clarity of presentation and are shown exaggerated in the drawings. Similarly, although the views in the drawings for ease of description generally show similar orientations, this depiction in the drawings is arbitrary for the most part. Generally, the present disclosure can be operated in any orientation.

The present disclosure is described by the following specific embodiments. Those with ordinary skills in the arts can readily understand the other advantages and functions of the present disclosure after reading the disclosure of this specification. The present disclosure can also be implemented with different embodiments. Various details described in this specification can be modified based on different viewpoints and applications without departing from the scope of the present disclosure.

Figure 2A:
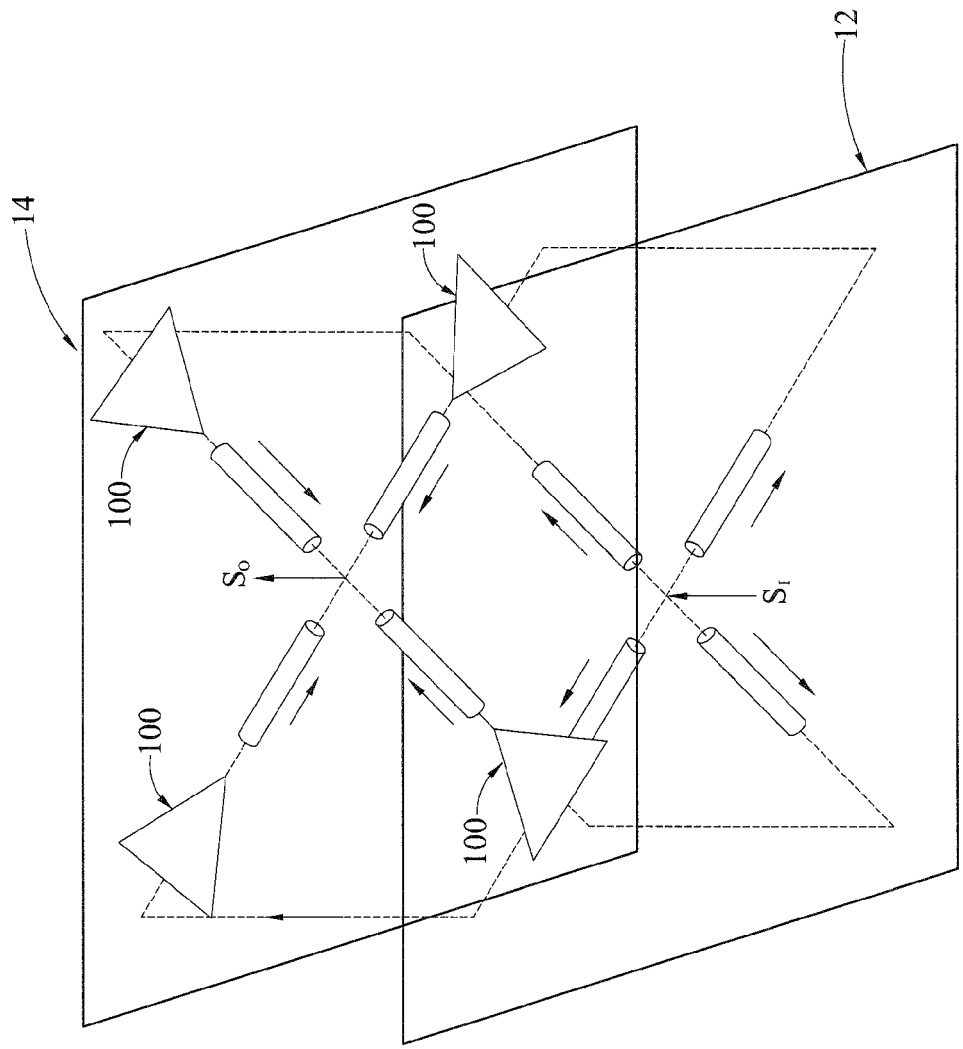
FIG. 2a is a three-dimensional (3-D) view illustrating a 3-D power amplifier architecture including a dual-radial symmetric mechanism according to the present disclosure.

The present disclosure provides a three-dimensional (3-D) power amplifier architecture 10, comprising a power splitting plane 12 and a power combining plane 14, as shown in FIG. 2a. In addition, an input terminal $S_I$ and an output terminal $S_O$ are positioned at the center nodes of the power splitting plane 12 and the power combining plane 14, respectively.

Figure 2B:
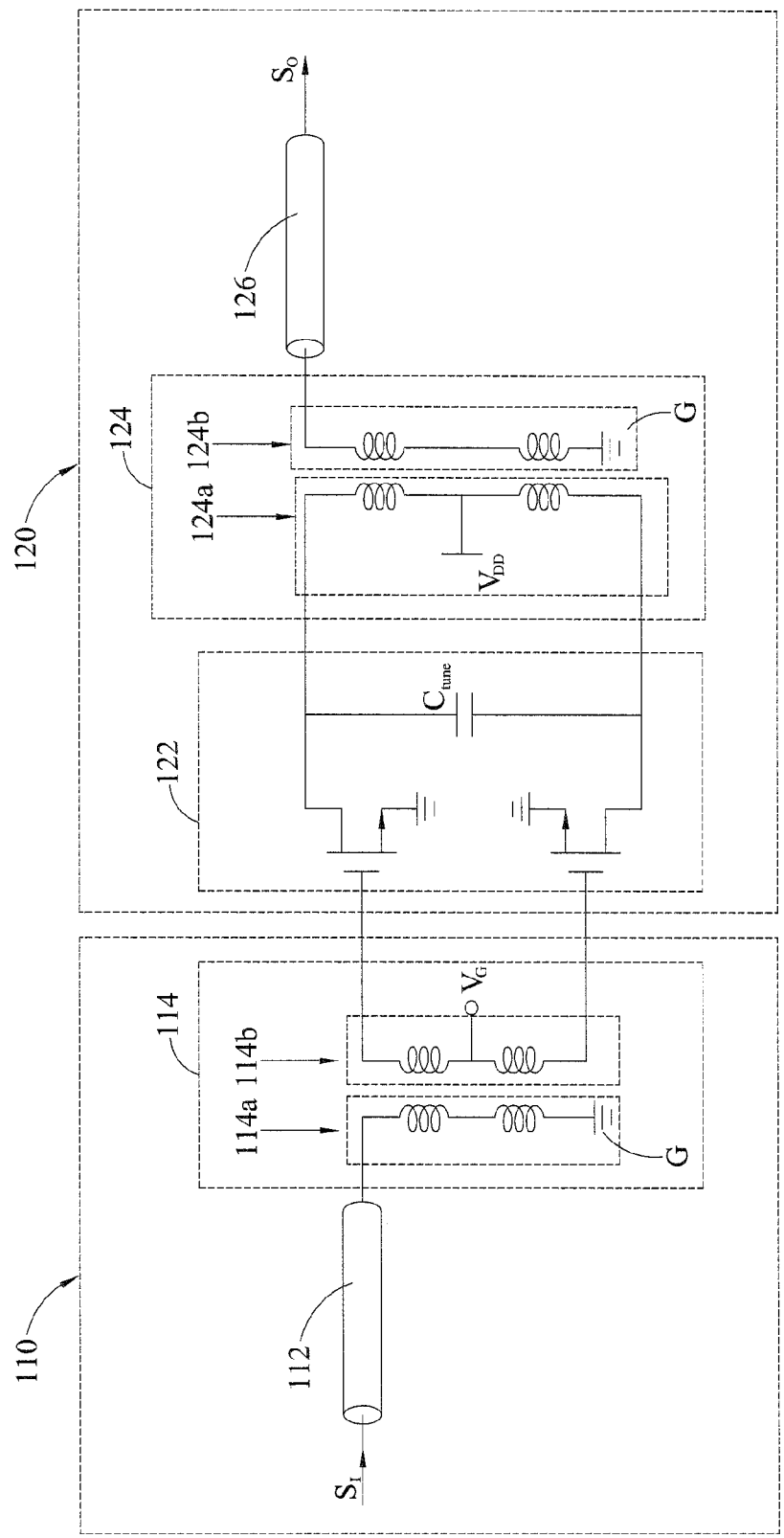
FIG. 2b is a circuit schematic diagram illustration the 3-D power amplifier architecture according to the present disclosure.

Referring to FIG. 2b, the power splitting plane 12 comprises at least one input transformer-based circuit 110. The power combining plane 14 comprises at least one output transformer-based circuit 120.

In one embodiment of the present disclosure, the at least one input transformer-based circuit 110 of the power splitting plane 12 comprises an input terminal $S_I$, at least one input transmission line 112 and at least one input transformer 114. As shown in FIG. 2b, the at least one output transformer-based circuit 120 of the power combining plane 14 comprises at least one power amplifier-cell (PA-cell) 122, at least one output transformer 124, at least one output transmission line 126 and an output terminal $S_O$. The power combining plane 12 is vertically stacked and attached to the power splitting plane 14. In other words, the power combining plane 14 is parallel to the power splitting plane 12, and electrically coupled to the power splitting plane 12 to form a single semiconductor chip.

Moreover, the present disclosure further comprises a radio-frequency (RF) or mixed-signal integrated circuit and an antenna (not shown). An RF or mixed-signal output signal of the RF or mixed-signal integrated circuit is electrically transmitted to the input terminal of the power splitting plane 12. The output terminal of the power combining plane 14 is electrically connected to an input of the antenna.

In an embodiment of the present disclosure, the RF or mixed-signal integrated circuit and the antenna are vertically stacked and attached to the 3-D power amplifier architecture 10.

According to the present disclosure, the 3-D power amplifier architecture 10 is a dual-radial symmetric architecture, as shown in FIG. 2a. Both the power splitting plane 12 and the power combining plane 14 are a radial symmetric power distribution network. As such, the power splitting plane 12 and the power combining plane 14 are vertically stacked up with a view to forming the dual-radial symmetric power distribution architecture.

Consequently, the 3-D dual-radial symmetric architecture of the present disclosure is dramatically different from the conventional 2-D power amplifier architecture since the conventional 2-D power amplifier cannot compromise between symmetry and the compact layout.

In one embodiment of the present disclosure, the at least one input transmission line 112 of the power splitting plane 12 is an impedance transformation network. Additionally, the at least one output transmission line 126 of the power combining plane 14 is also an impedance transformation network.

According to the present disclosure, the at least one input transformer 114 of the power splitting plane 12 may be a single-ended to differential structure, and comprises a first winding 114a and a second winding 114b. The at least one output transformer 124 of the power combining plane 14 may be a differential to single-ended structure, and comprises a first winding 124a and a second winding 124b.

According to the present disclosure, the at least one input transmission line 112 is structured to provide impedance matching between the input terminal $S_I$ and the first winding 114a of the at least one input transformer 114. The at least one output transmission line 126 is structured to provide impedance matching between the output terminal $S_O$ and the second winding 124b of the at least one output transformer 124.

In one example of the present disclosure, the first windings 114a, 124a and the second winding 114b, 124b may be inductance, multi-turn coil inductance, slab inductors and the like.

In one example of the present disclosure, the at least one PA-cell 122 may be a pseudo differential amplifier, comprising a pair of power transistors. The power transistors may be designed in a common source configuration. The size of the power transistors may be selected by compromising the maximum stable gain (MSG) and output power. For example, each of the power transistors has MSG of 7.3 dB at 60 G-Hz with current density of 0.5 mA/μm at a 1.2V supply voltage. With regard to the transistor mismatch and potential odd-mode oscillation, the odd-mode suppression resistor of 10Ω is embedded into each PA-cell. Additionally, the tuning capacitor $C_{tune}$ is adopted to resonant with the first winding for maximum power transfer, as shown in FIG. 2b.

According to the present disclosure, the input terminal $S_I$ and the output terminal $S_O$ are positioned at the center nodes of the power splitting plane 12 and the power combining plane 14, respectively.

In one embodiment of the present disclosure, an electrical signal is fed into the input terminal $S_I$ of the power splitting plane 12. The input terminal $S_I$ is electrically connected to one port of the at least one input transmission line 112, and another port of the at least one input transmission line 112 is electrically connected to the first winding 114a of the at least one input transformer 114. The second winding 114b of the least one input transformer 114 of the power splitting plane 12 is coupled in series with the input of the least one PA-cell 122 of the power combining plane 14. The output of the PA-cell 122 is electrically connected to the first winding 124a of the at least one output transformer 124. Subsequently, the second winding 124b of the at least one output transformer 124 is electrically connected to one port of the at least one output transmission line 126. Another port of the at least one output transmission line 126 is electrically connected to the output terminal $S_O$. Accordingly, the electrical signal is outputted from the output terminal $S_O$ of the power combining plane 14.

Figure 3:
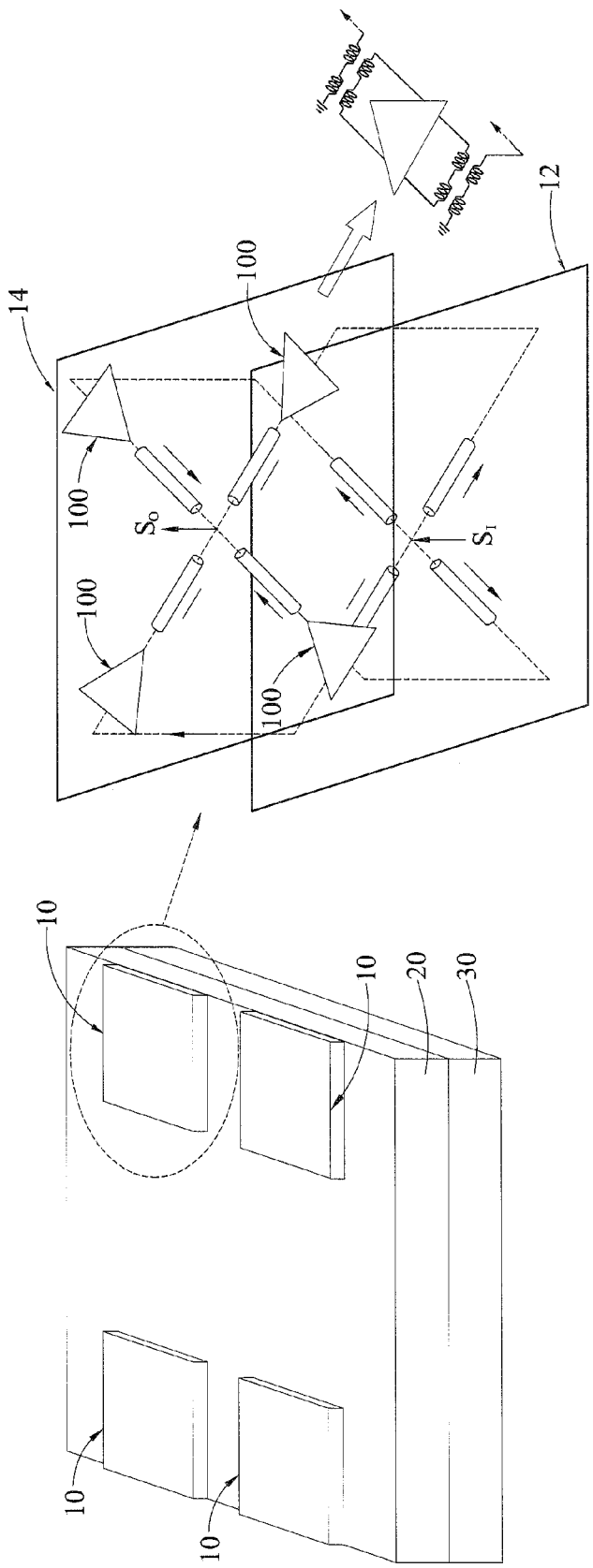
FIG. 3 is a 3-D schematic diagram illustrating a 3-D integrated circuit including the 3-D power amplifier architecture, a radio-frequency (RF)/mixed-signal integrated circuit, a baseband integrated circuit and an antenna according to the present disclosure.

Referring to FIG. 3, FIG. 3 shows a 3-D schematic diagram of a 3-D integrated circuit including a plurality of 3-D power amplifier architectures 10, a RF/mixed-signal integrated circuit 20, a baseband integrated circuit 30 and an antenna (not shown) according to the present disclosure. The 3-D integrated circuit is a single chip in which the plurality of 3-D power amplifier architectures 10, the RF/mixed-signal integrated circuit 20, the baseband integrated circuit 30 and the antenna (not shown) are integrated vertically into a single circuit.

In other words, the antenna (not shown) is vertically and electrically connected to the plurality of 3-D power amplifier architectures 10. Then, the plurality of 3-D power amplifier architectures 10 are vertically and electrically connected to the RF/mixed-signal integrated circuit 20. Subsequently, the RF/mixed-signal integrated circuit 20 and the baseband integrated circuit 30 (i.e., the baseband chip) are also vertically and electrically connected. In one example of the present disclosure, four 3-D power amplifiers 100 adopts a two-way TF-based current splitting/combining technique, as shown in FIG. 3, based on the consideration of the symmetric layout and feasibility.

According to another embodiment of the present disclosure, the 3-D power amplifier architecture may include more than four 3-D power amplifiers such as eight 3-D power amplifiers.

In accordance with an alternative embodiment of the present disclosure, the 3-D power amplifier architecture may also include sixteen 3-D power amplifiers.

As such, the present disclosure is not limited to four, eight and sixteen 3-D power amplifiers.

In one embodiment of the present disclosure, the 3-D power amplifier architecture 10 may be designed and fabricated in semiconductor technology such as CMOS technology and so forth.

According to another embodiment of the present disclosure, the 3-D power amplifier architecture 10 is able to achieve N-way power combining in a compact chip area, where N is an integer and a power of two. In other words, the total active chip area including the power splitting and power combining networks can be really small and compact.

Figure 4A:
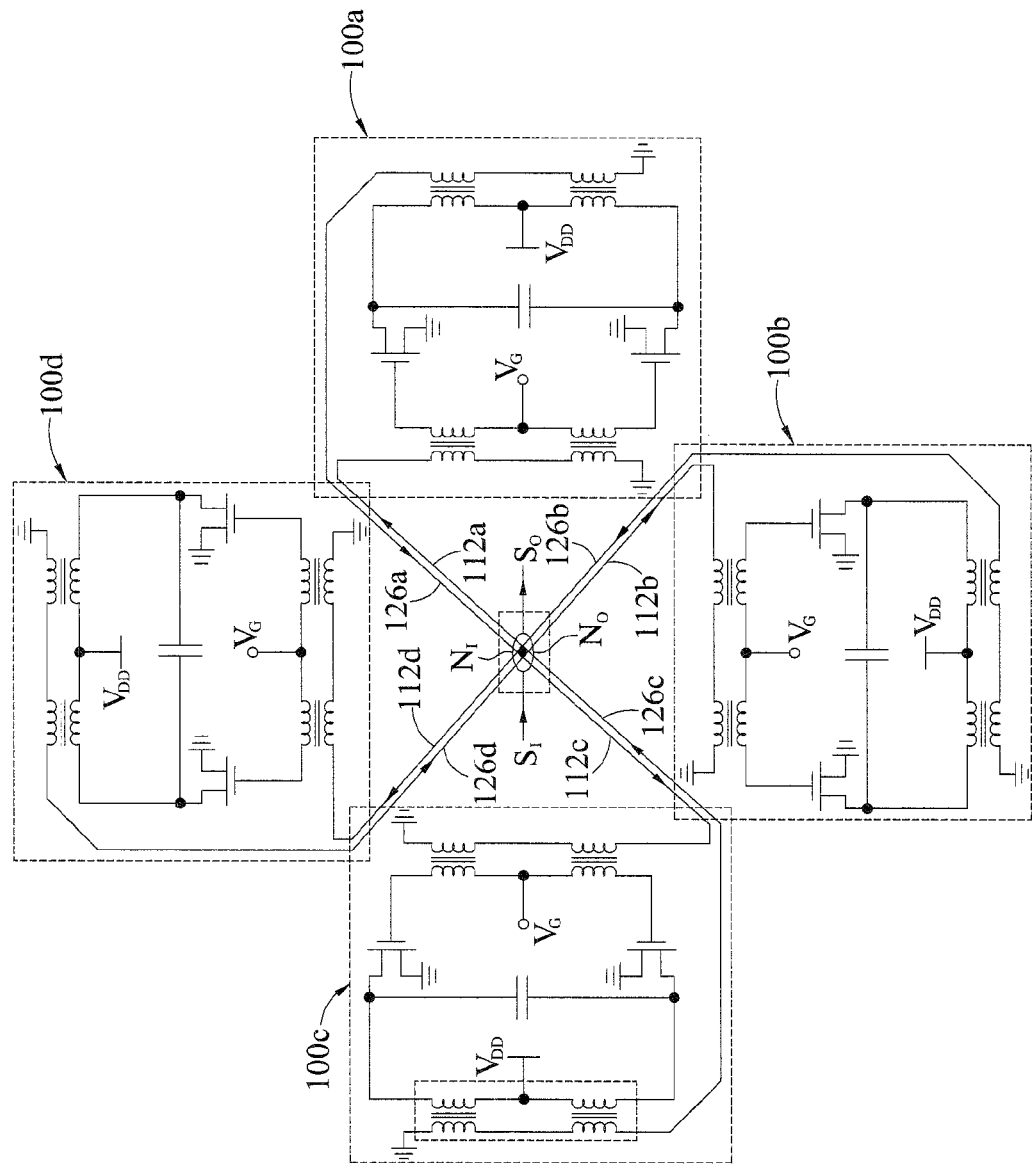
FIG. 4a is a schematic diagram illustrating the 3-D power amplifier architecture including a plurality of 3-D power amplifiers according to the present disclosure.

In one embodiment of the present disclosure, the 3-D power amplifier architecture 10 includes a plurality of 3-D power amplifiers 100a, 100b, 100c and 100d, a plurality of input transmission lines 112a, 112b, 112c and 112d and a plurality of output transmission line 126a, 126b, 126c and 126d, as shown in FIG. 4a. Each of the plurality of 3-D power amplifiers 100a, 100b, 100c and 100d includes one input transformer, one PA-cell and one output transformer. The plurality of input transmission lines 112a, 112b, 112c and 112d of the plurality of 3-D power amplifier architecture 10 are electrically connected to a center input node $N_I$. The plurality of output transmission lines 126a, 126b, 126c and 126d of the plurality of 3-D power amplifier architecture 10 are electrically connected to a center output node $N_O$. The center input node $N_I$ and the center output node $N_O$ are in the center region of the 3-D power amplifier architecture 10.

Figure 4B:
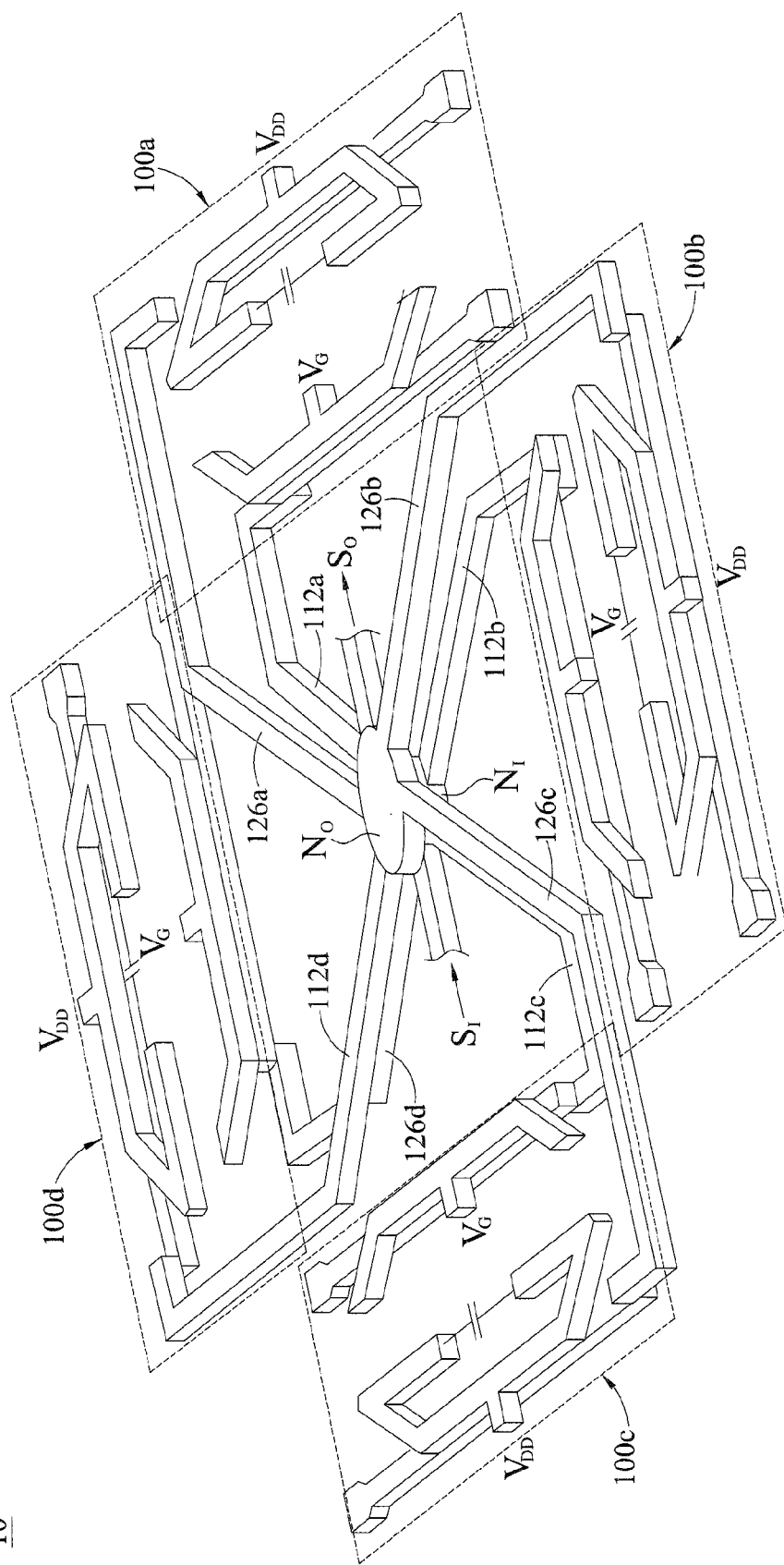
FIG. 4b is a 3-D integrated circuit (IC) layout diagram illustrating the 3-D power amplifier architecture including a plurality of 3-D power amplifiers according to the present disclosure.

FIG. 4b shows a 3-D IC layout diagram for the 3-D power amplifier architecture 10 corresponding to the schematic diagram of FIG. 4a. The 3-D power amplifier architecture 10 includes a plurality of 3-D power amplifiers 100a, 100b, 100c and 100d, a plurality of input transmission lines 112a, 112b, 112c and 112d and a plurality of output transmission line 126a, 126b, 126c and 126d, as shown in FIG. 4a. Each of the plurality of 3-D power amplifiers 100a, 100b, 100c and 100d includes one input transformer, one PA-cell and one output transformer. The plurality of input transmission lines 112a, 112b, 112c and 112d of the plurality of 3-D power amplifier architecture 10 are electrically connected to a center input node $N_I$. The plurality of output transmission lines 126a, 126b, 126c and 126d of the plurality of 3-D power amplifier architecture 10 are electrically connected to a center output node $N_O$. The center input node $N_I$ and the center output node $N_O$ are in the center region of the 3-D power amplifier architecture 10.

Figure 5A:
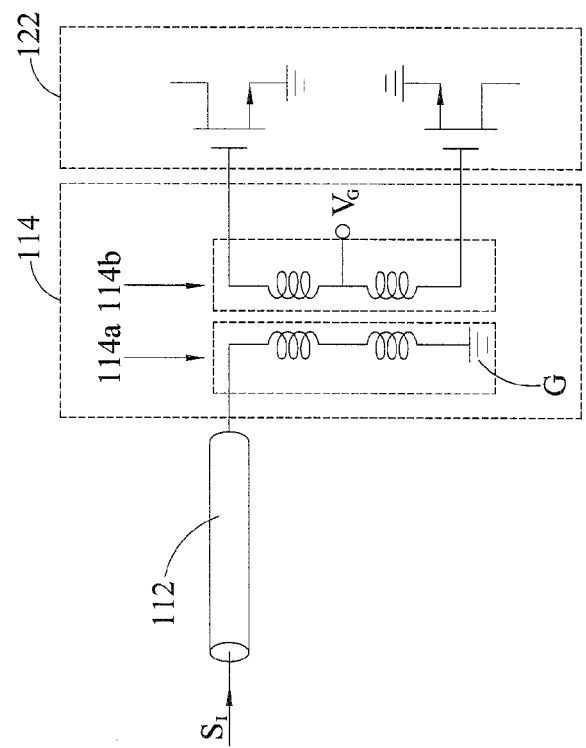
FIG. 5a shows a layout diagram illustrating the input radial distribution network of the 3-D power amplifier architecture including a plurality of 3-D power amplifiers according to the present disclosure.
Figure 5A:
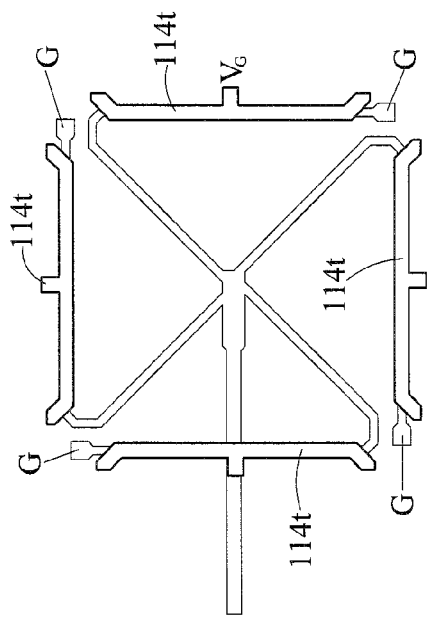
Figure 5A:
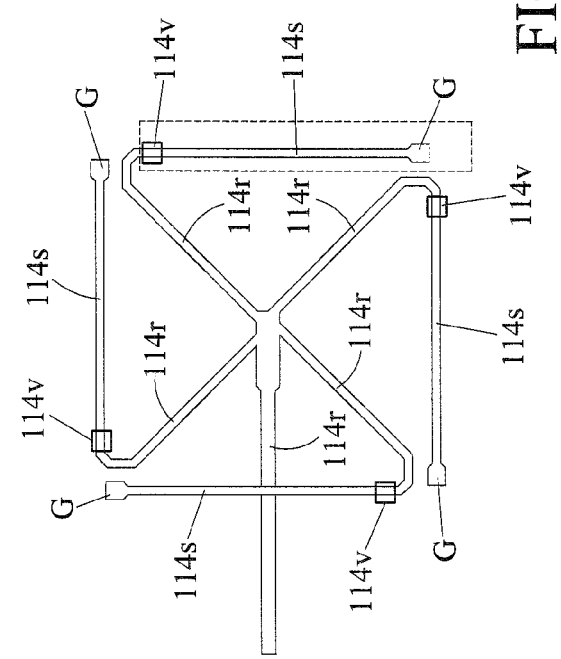

Now referring to FIG. 5a, FIG. 5a shows a layout diagram illustrating the input radial distribution network of the 3-D power amplifier architecture 10 including a plurality of 3-D power amplifiers. The first winding 114a of the input transformer 114 is made up of a first metal layer 114r, a second metal layer 114s and a via 114v. The first metal layer 114r represents the input transmission line. As such, the plurality of first metal layers 114r are electrically connected to a center input node. The center input node is electrically connected to an input terminal. The input terminal is also made up of the first metal layer 114r. A RF signal is fed into the first metal layer 114r. The second metal layer 114s represents inductance of the first winding. The first metal layer 114r electrically connects with one end of the second metal layer 114s by using the via 114v. Another end of the second metal 114s is electrically connected to ground G.

The second winding 114b of the input transformer 114 is made up of a third metal layer 114t. Two ends of the third metal layer 114t are respectively connected to the gates of the power transistors of the PA-cell 122.

Figure 5B:
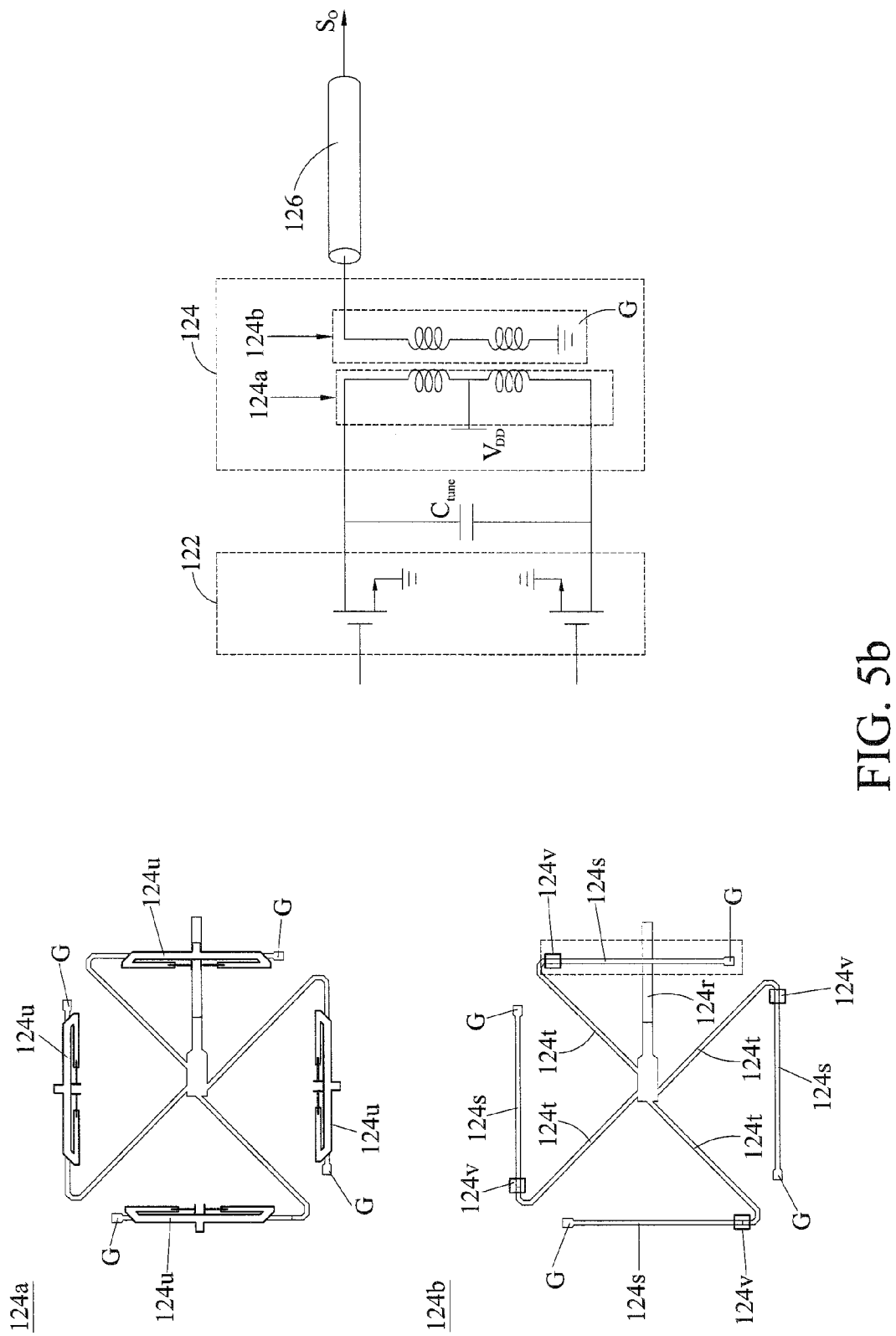
FIG. 5b shows a layout diagram illustrating the output radial distribution network of the 3-D power amplifier architecture including a plurality of 3-D power amplifiers according to the present disclosure.

Additionally, FIG. 5b shows a layout diagram illustrating the output radial distribution network of the 3-D power amplifier architecture including a plurality of 3-D power amplifiers according to the present disclosure. The second winding 124b of the output transformer 124 is made up of a fourth metal layer 124r, a fifth metal layer 124s, a sixth metal layer 124t and a via 124v. The fourth metal layer 124r represents an output terminal. Inductance of the second winding is made up of the fifth metal layer 124s. The sixth metal layer 124t represents the output transmission line. As such, the plurality of sixth metal layer 124t are electrically connected to a center output node. The center output node is electrically connected to the output terminal. The sixth metal layer 124t electrically connects with one end of the fifth metal layer 124s by using the via 124v. Another end of the fifth metal layer 124s is electrically connected to ground G.

The first winding 124a of the output transformer 124 is made up of a seventh metal layer 124u. Two ends of the seventh metal layer 124u are respectively connected to the gates of the drains of the power transistors of the PA-cell 122.

In one example of the present disclosure, the first winding 114a and the second winding 114b of the input transformer 114 may be inductance, multi-turn coil inductance, slab inductance and the like.

According to the present disclosure, the first winding 124a and the second winding 124b of the output transformer 124 may be inductance, multi-turn coil inductance, slab inductance and the like.

In one example of the present disclosure, the PA-cell 122 may be a pseudo differential amplifier, comprising a pair of power transistors. The power transistors may be designed in a common source configuration. Moreover, the size of the power transistors may be selected by compromising the MSG and output power.

In accordance with the present disclosure, the present disclosure further comprises a radio-frequency (RF) or mixed-signal integrated circuit chip and an antenna (not shown). An RF or mixed-signal output signal of the RF or mixed-signal integrated circuit chip is electrically connected to the input terminal of the power splitting plane 12. The output terminal of the power combining plane 14 is electrically connected to an input of the antenna.

Besides, the RF or mixed-signal integrated circuit chip and the antenna are vertically stacked and attached to the 3-D power amplifier architecture 10.

The resulting 3-D power amplifier architecture 10 of the present disclosure is cost-effective, uncomplicated, highly versatile and effective, and can be implemented by adopting known semiconductor technology for efficient and economical manufacturing, application and utilization.

Another important aspect of the present disclosure is that it valuably supports and services the trend of reducing costs, simplifying systems, and increasing performance.

While the invention has been described in conjunction with a specific best mode, it is to be understood that many alternatives, modifications, and variations will be apparent to those skilled in the art in light of the aforesaid description. Accordingly, it is intended to embrace all such alternatives, modifications, and variations that fall within the scope of the included claims. All matters heretofore set forth herein or shown in the accompanying drawings are to be interpreted in an illustrative and non-limiting sense.

What is claimed is:

1. A three-dimensional (3-D) power amplifier architecture, comprising:
    a power splitting plane comprising at least one input transformer-based circuit having at least one input transmission line, at least one input transformer and an input terminal; and
    a power combining plane comprising at least one output transformer-based circuit having at least one output transmission line, at least one output transformer, at least one power amplifier-cell (PA-cell) and an output terminal, wherein the power combining plane is vertically stacked and electrically connected to the power splitting plane, the 3-D power amplifier architecture is a dual-radial symmetric architecture, and the input terminal and the output terminal are positioned at center nodes of the power splitting plane and the power combining plane, respectively.

2. The 3-D power amplifier architecture as claimed in claim 1, further comprising:
    a radio-frequency (RF)/mixed-signal integrated circuit, wherein an output of the RF/mixed-signal integrated circuit is vertically and electrically connected to the input terminal of the power splitting plane;
    a baseband integrated circuit, wherein an output of the baseband integrated circuit is vertically and electrically connected to an input of the RF/mixed-signal integrated circuit; and
    an antenna, wherein the output terminal of the power combining plane is vertically and electrically connected to an input of the antenna, and the RF/mixed-signal integrated circuit, the baseband integrated circuit and the antenna are vertically stacked, attached and electrically connected to the 3-D power amplifier architecture.

3. The 3-D power amplifier architecture as claimed in claim 1, wherein the at least one input transmission line is an impedance transformation network.

4. The 3-D power amplifier architecture as claimed in claim 1, wherein the at least one output transmission line is an impedance transformation network.

5. The 3-D power amplifier architecture as claimed in claim 1, wherein the at least one input transformer is a single-ended to differential structure, comprising a first winding and a second winding.

6. The 3-D power amplifier architecture as claimed in claim 1, wherein the at least one output transformer is a differential to single-ended structure, comprising a first winding and a second winding.

7. The 3-D power amplifier architecture as claimed in claim 5, wherein the first winding and the second winding are inductance, multi-turn coil inductance or slab inductance.

8. The 3-D power amplifier architecture as claimed in claim 1, wherein the at least one PA-cell is a pseudo differential amplifier, comprising a pair of power transistors.

9. The 3-D power amplifier architecture as claimed in claim 1, wherein an electrical signal is fed into the input terminal of the power splitting plane, and the electrical signal is outputted from the output terminal of the power combining plane.

10. The 3-D power amplifier architecture as claimed in claim 1, wherein the input terminal is electrically connected to one port of the at least one input transmission line, and another port of the at least one input transmission line is electrically connected to the first winding of the at least one input transformer.

11. The 3-D power amplifier architecture as claimed in claim 1, wherein the second winding of the at least one input transformer of the power splitting plane is electrically connected to the input of the at least one PA-cell of the power combining plane.

12. The 3-D power amplifier architecture as claimed in claim 1, wherein the output of the PA-cell is electrically connected to the first winding of the at least one output transformer, the second winding of the at least one output transformer is electrically connected to one port of the at least one output transmission line, and another port of the at least one output transmission line is electrically connected to the output terminal of the power combining plane.

13. The 3-D power amplifier architecture as claimed in claim 1, wherein the power combining plane is electrically coupled to the power splitting plane to form a single semiconductor chip.

14. An integrated circuit (IC) layout for a three-dimensional (3-D) power amplifier architecture, comprising:
- a power splitting plane having at least one input transmission line, at least one input transformer and an input terminal; and
- a power combining plane having at least one output transmission line, at least one output transformer, at least one power amplifier-cell (PA-cell) and an output terminal, wherein the power combining plane and the power splitting plane are vertically stacked, electrically connected and placed in different layers, the 3-D power amplifier architecture is a dual-radial symmetric architecture, and the input terminal and the output terminal are positioned at center nodes of the power splitting plane and the power combining plane, respectively.

15. The IC layout as claimed in claim 14, further comprising:
- a radio-frequency (RF)/mixed-signal integrated circuit chip, wherein an output of the RF/mixed-signal integrated circuit chip is electrically connected to the input terminal of the power splitting plane;
- a baseband integrated circuit, wherein an output of the baseband integrated circuit is vertically and electrically connected to an input of the RF/mixed-signal integrated circuit; and
- an antenna, wherein the output terminal of the power combining plane is vertically and electrically connected to an input of the antenna, and the 3-D power amplifier architecture, the RF/mixed-signal integrated circuit chip, the baseband integrated circuit and the antenna are vertically and electrically connected and placed in different layers.

16. The IC layout as claimed in claim 14, wherein the at least one input transmission line is an impedance transformation network.

17. The IC layout as claimed in claim 14, wherein the at least one output transmission line is an impedance transformation network.

18. The IC layout as claimed in claim 14, wherein the at least one input transformer is a single-ended to differential structure, comprising a first winding and a second winding.

19. The IC layout as claimed in claim 14, wherein the at least one output transformer is a differential to single-ended structure, comprising a first winding and a second winding.

20. The IC layout as claimed in claim 19, wherein the first winding and the second winding are inductance, multi-turn coil inductance or slab inductance.

21. The IC layout as claimed in claim 14, wherein the at least one PA-cell is a pseudo differential amplifier, comprising a pair of power transistors.

22. The IC layout as claimed in claim 14, wherein an electrical signal is fed into the input terminal of the power splitting plane, and the electrical signal is outputted from the output terminal of the power combining plane.

23. The IC layout as claimed in claim 14, wherein the input terminal is electrically connected to one port of the at least one input transmission line, and another port of the at least one input transmission line is electrically connected to the input of the at least one input transformer.

24. The IC layout as claimed in claim 14, wherein the second winding of the at least one input transformer of the power splitting plane is electrically connected to the input of the at least one PA-cell of the power combining plane.

25. The IC layout as claimed in claim 14, wherein the output of the PA-cell is electrically connected to the first winding of the at least one output transformer, the second winding of the at least one output transformer is electrically connected to one port of the at least one output transmission line, and another port of the at least one output transmission line is electrically connected to the output terminal of the power combining plane.

\* \* \* \* \*